United States Patent [19]
Weber et al.

[11] Patent Number: 5,920,459
[45] Date of Patent: Jul. 6, 1999

[54] ELECTRICAL CONNECTOR HOUSING FOR CIRCUIT BOARD ASSEMBLY

[75] Inventors: Ronald Martin Weber, Annville; Jeffrey Allen Zeiders, Hummelstown, both of Pa.

[73] Assignee: The Whitaker Corporation, Wilmington, Del.

[21] Appl. No.: 08/794,513

[22] Filed: Feb. 4, 1997

[51] Int. Cl.⁶ .............................. H05K 5/00; H01R 13/00
[52] U.S. Cl. .......................... 361/752; 361/759; 361/801; 439/346; 439/362
[58] Field of Search .................................... 361/728, 738, 361/737, 740, 748, 752, 796, 801; 174/52.1; 439/346–362

[56] References Cited

U.S. PATENT DOCUMENTS

| | | | |
|---|---|---|---|
| 4,221,458 | 9/1980 | Hughes et al. | 339/126 R |
| 5,007,858 | 4/1991 | Daly et al. | 439/498 |
| 5,159,534 | 10/1992 | Hudson | 361/391 |
| 5,162,000 | 11/1992 | Frantz | 439/607 |
| 5,197,900 | 3/1993 | Ellis et al. | 439/352 |
| 5,217,394 | 6/1993 | Ho | 439/620 |
| 5,218,758 | 6/1993 | Nguyen | 29/837 |
| 5,266,047 | 11/1993 | Black et al. | 439/364 |
| 5,342,216 | 8/1994 | Davis et al. | 439/362 |
| 5,386,487 | 1/1995 | Briggs et al. | 385/59 |
| 5,430,618 | 7/1995 | Huang | 361/752 X |
| 5,647,758 | 7/1997 | Ichikawa et al. | 439/362 |
| 5,729,431 | 3/1998 | Marwah et al. | 361/687 |

FOREIGN PATENT DOCUMENTS

| | | | |
|---|---|---|---|
| 0668715 A1 | 8/1995 | European Pat. Off. | H05K 7/20 |
| 531801 | 12/1972 | Switzerland | H01R 23/02 |

OTHER PUBLICATIONS

International Search Report in corresponding PCT/US98/02360 mailed May 18, 1998; three pages.
AMP Customer Drawing No. 749556, "Plug Subassembly, 40 Position, Termination Connector, AMPHLIMITE, .050 Series", Jan. 15, 1990; AMP Incorporated, Harrisburg, PA.

Primary Examiner—Leo P. Picard
Assistant Examiner—Jayprakash N. Gandhi
Attorney, Agent, or Firm—Anton P. Ness

[57] ABSTRACT

An electrical housing (12) for a circuit board assembly (14) comprises interfitting upper and lower housing members (16,18) along which the circuit board assembly is disposed when the housing members are fitted and secured together. One end of the housing members (16,18) has connector-receiving recesses (50,58) in which an electrical connector (88) on the circuit board assembly is disposed for positioning the circuit board assembly longitudinally relative to the housing members. Vertical positioning members (26,68) on the housing members are provided for vertically positioning the circuit board assembly within the housing members. Jack screw-positioning members (32,34,40;74,76,78) are provided by the housing members (16,18) for positioning jack screws (46) within the housing members (16,18) and maintaining the jack screws therein so that they are captured therein.

10 Claims, 3 Drawing Sheets

ELECTRICAL CONNECTOR HOUSING FOR CIRCUIT BOARD ASSEMBLY

FIELD OF THE INVENTION

The present invention relates to electrical housings and more particularly to electrical housings for circuit board assemblies.

BACKGROUND OF THE INVENTION

Media Independent Interface (MII) Transceivers are used to connect workstations to Fast Ethernet hubs, switches and routers. These transceivers typically include circuit board assemblies having interconnected mother and daughter boards or mother boards on which electrical connectors or electrical connectors and fiber optic connectors are provided. The circuit board assemblies are mounted in electrical housings having jack screws for mounting the transceivers to hubs and switches. The electrical housings used in these transceivers are stamped and formed from metal sheets resulting in large-size housings that are bulky and require a lot of metal to make. The assembly of the various parts to form the transceivers is very difficult because of the number of parts involved and alignment of the parts in the housing is also difficult. These operations are time consuming, thereby increasing the cost of the transceivers. Moreover, the jack screws are floatably mounted in the housings and not captured therein.

Accordingly, a need arose to provide an electrical housing that would enable circuit board assemblies to be easily positioned and aligned therein in an efficient and cost-saving manner.

In addition, there has been a need to provide an electrical housing with jack screws captured therein so that they would not float and remain in place.

SUMMARY OF THE INVENTION

The electrical housing for circuit board assemblies having at least one electrical connector thereon comprises interfitting upper and lower housing members along which a circuit board assembly is disposed when the housing members are fitted and secured together. One end of the housing members has connector-engaging portions for engaging the electrical connector on the circuit board assembly for positioning the circuit board assembly longitudinally relative to the housing members and maintaining the connector in position therebetween. Positioning members are provided on the housing members for vertical positioning the circuit board assembly within the housing members, and jack screw-positioning members are provided by the housing members for positioning jack screws within the housing members and maintaining the jack screws in position therein so that they are operationally captured therein. The circuit board assembly positioning members form a ground connection with the circuit board assembly.

BRIEF DESCRIPTION OF THE DRAWINGS

An embodiment of the present invention will now be described by way of example with reference to the accompanying drawings, in which.

DETAILED DESCRIPTION OF THE INVENTION

Figure 1:
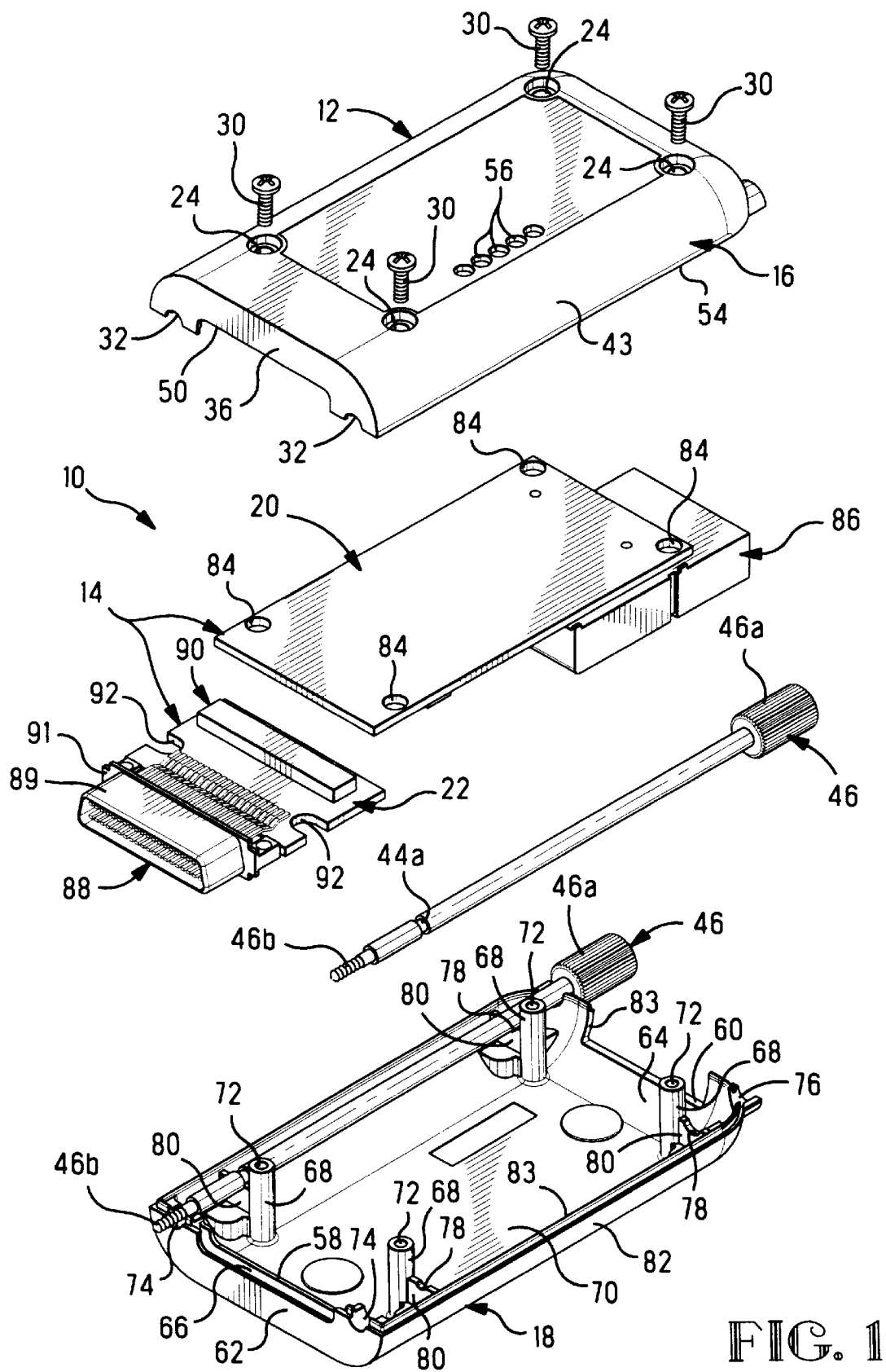
FIG. 1 is an isometric exploded view of a Media Independent Interface Transceiver including a circuit board assembly, an electrical housing therefor and jack screws.

As shown in FIGS. 1 to 4, a Media Independent Interface (MII) Transceiver 10 comprises a metal housing 12 and a circuit board assembly 14. The MII Transceiver is to be used to connect workstations, switches or hubs to other Fast Ethernet workstations, hubs and switches. While the present invention relating to the electrical housing is used in conjunction with the circuit board assembly forming the electronic circuits of the transceiver, other circuit board assemblies for other electronic circuits can be housed in the electrical housing.

Electrical housing 12 includes an upper housing member 16 and a lower housing member 18, which interfit with one another; circuit board assembly 14 includes a mother board 20 and a daughter board 22.

Upper housing member 16 and lower housing member 18 are formed as metal die cast members in accordance with conventional metal die cast practices and the metal used is preferably zinc.

Figure 2:
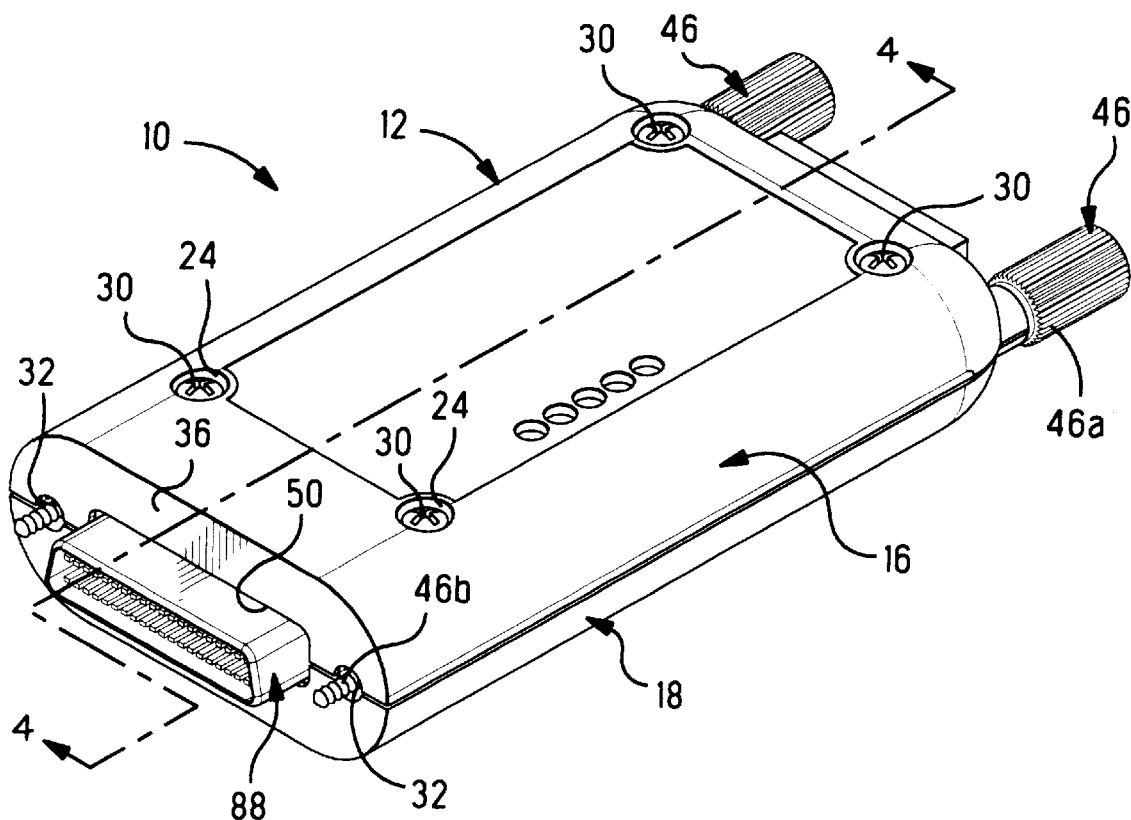
FIG. 2 is a isometric view showing FIG. 1 in an assembled form.

Upper housing member 16 has counter sunk holes 24 extending through raised members 26 on an inside surface 28 of upper housing member 16. Holes 24 receive screws 30 for securing housing members 16,18 together (FIG. 2). Arcuate recesses 32,34 are located at outer ends of a front wall 36 and a rear wall 38 of upper housing member 16. Arcuate recesses 40 (FIG. 3) are also located in extensions 42 extending inwardly from the side walls 43 of upper housing member 16 adjacent to and in alignment with front raised members 26. Arcuate recesses 32,34,40 along each side of upper housing member 16 are aligned for accommodating shafts 44 of jack screws 46. A groove 48 is located in a U-shaped recess 50 in front wall 36. A U-shaped recess 52 is also located in rear wall 38. An outer flange 54 extends along the inner edges of the front, side and rear walls of upper housing member 16. A series of holes 56 extend through the upper housing member 16 in alignment with LEDs (not shown) on the mother board of the circuit board assembly 20 to indicate operating status.

Figure 4:
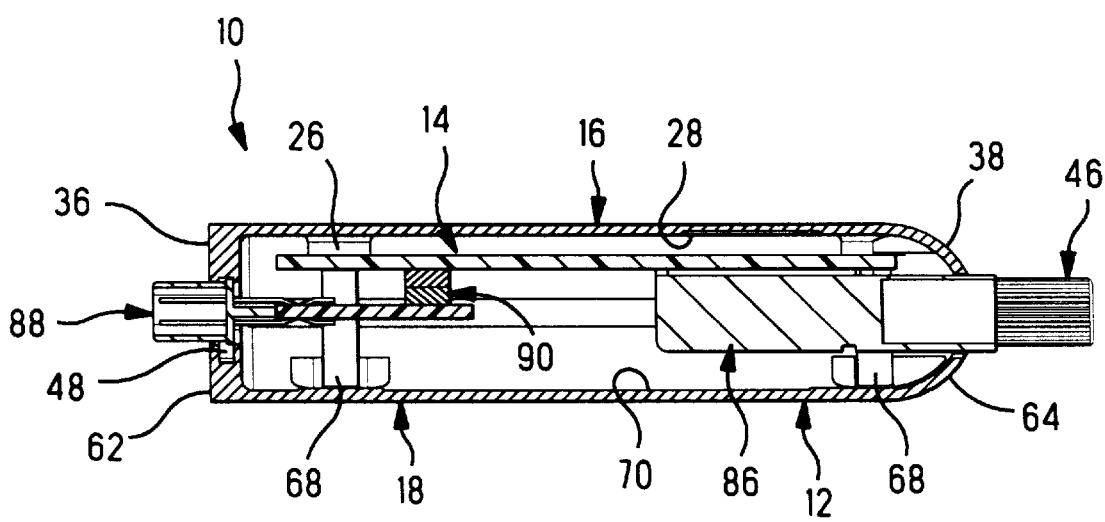
FIG. 4 is a cross-sectional view taken along line 4—4 of FIG. 2.
Figure 3:
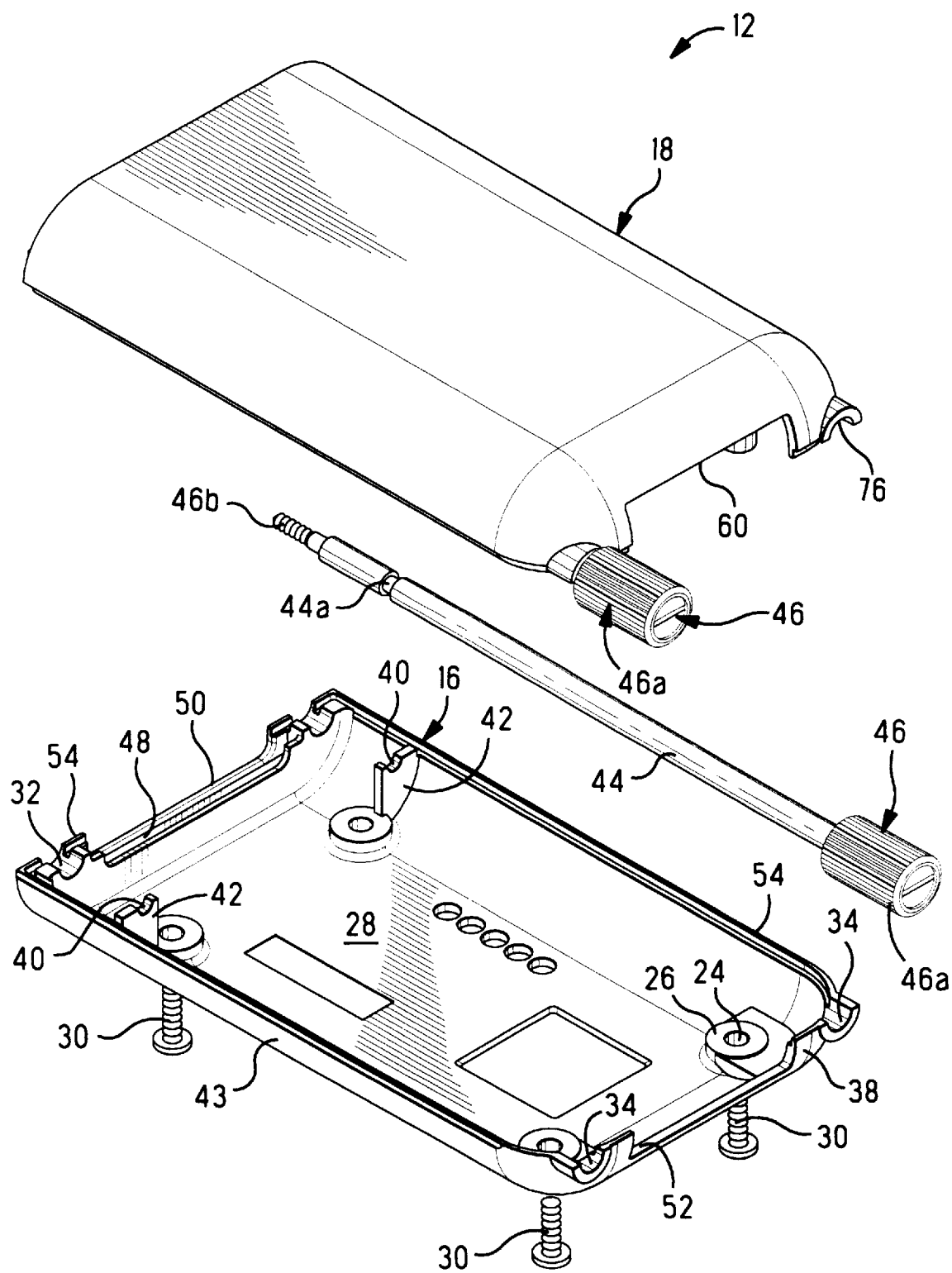
FIG. 3 is a isometric and exploded view of an upper housing member and a lower housing member of the electrical housing.

Lower housing member 18 has U-shaped recesses 58,60 in front and rear walls 62,64, respectively. A groove 66 is located in U-shaped recess 58. Circuit board columnar mounting members 68 extend inwardly from an inside surface 70 of lower housing member 18 in alignment with holes 24 of the upper housing member 16, and mounting members 68 have threaded holes 72 thereinto to receive the threaded shanks of screws 30 to secure the housing members together as well as to mount and secure the circuit board assembly 14 therebetween (FIG. 4). Threaded holes 72 are threaded by a conventional rolling operation to preclude formation of any metal chips that could effect the operation of the electronic circuits. Arcuate recesses 74,76 are located at outer ends of front and rear walls 62,64, respectively, of lower housing member 18. Arcuate recesses 78 are also located in extensions 80 extending inwardly from the side walls 82 of lower housing member 18 in alignment with respective mounting members 68. Arcuate recesses 74,76,78 of lower housing member 18 are aligned with arcuate recesses 32,34,40 of the upper housing member 16 and these aligned recesses accommodate shafts 44 of jack screws 46 when housing members 16,18 are secured together. Annular grooves 44a in shafts 44 are disposed in opposed arcuate recesses 40,78 of upper and lower housing members 16,18 which act to capture the jack screws 46 thereby preventing them from floating and being removed unless the housing members are separated. An inner flange 83 extends along the inner edges of the front, side and rear walls of lower housing member 18. Inner flange 83 overlaps with outer flange 54 of upper housing member 16 when housing members 16,18 are secured together to prevent EMI and RFI leakage.

Mother board 20 on which the electronic circuits are located has plated-through holes 84 at the corners and a fiber optic connector 86 disclosed in U.S. Pat. No. 5,386,487 is mounted at an outer end thereof. Alternatively, connector 86 can be an electrical connector of the type disclosed in U.S. Pat. No. 4,221,485. Plated-through holes 84 are arranged for alignment and engagement with mounting members 68 and 26 when the circuit board assembly 14 is positioned in lower housing member 18; and when the housing members 16, 18 are secured together via screws 30 between mounting members 68 and raised members 26, as shown in FIG. 4, a ground connection is made between the housing 12 and the circuit board assembly 14.

Daughter board 22 has shielded electrical connector 88 mounted at an outer end, and one half of a conventional stacking electrical connector 90 mounted at an inner end which mates with the other half (see FIG. 4) which is mounted at an inner end of mother board 20, thereby electrically interconnecting the circuit boards 20, 22. Circuit paths on daughter board 22 interconnect the electrical contacts between connectors 88,90. Connector 88 may be an AMPLIMITE connector sold by AMP Incorporated, Harrisburg, Pa. having Part No. 749556.

Daughter board 22 has opposed recesses 92 between connectors 88,90 for registration with respective mounting members 68 on lower housing member 18 when the circuit board assembly is positioned therein, thereby assisting in the longitudinal arrangement of the circuit board assembly in the housing 12.

Shield 89 of connector 88 has a peripheral flange 91 that is disposed in groove 66 in U-shaped recess 58 of lower housing member 18 when the circuit board assembly 14 is positioned therein, and flange 91 also is disposed in groove 48 of U-shaped recess 50 of the upper housing member 16 when housing members 16,18 are secured together. Disposition of flange 91 in groove 66 and recesses 92 along mounting members 68 positions circuit board assembly 14 longitudinally along lower housing member 18.

Connector 86 is located in recesses 52,60 of housing members 16,18 and between mounting members 68 adjacent recess 60, and connector 88 is disposed in recesses 50,58 of housing members 16,18 when the housing members are secured together.

To assemble the circuit board assembly 14 into housing 12 to form a Media Independent Interface Transceiver 10, circuit board assembly 14 is positioned in lower housing member 18 by moving the circuit board assembly 14 vertically downward toward lower housing member 18 with flange 91 being disposed in groove 66 while the front part of connector 88 is positioned in recess 58. Simultaneously, recesses 92 of daughter board 22 slide along mounting members 68 until plated through holes 84 of mother board 20 rest on the upper ends of mounting members 68 and a rear part of connector 86 is positioned between mounting members 68 while a front part of connector 86 is disposed in recess 60. As shown in FIG. 4, upper ends of mounting members 68 extend above a plane containing the flange 83 so that daughter board 22 is located centrally of housing 12 and mother board 20 extends along a plane parallel with but spaced slightly inward from inner surface 28 of upper housing member 16.

Shafts 44 of jack screws 46 are disposed in arcuate recesses 74,76 while annular grooves 44a are disposed in arcuate recesses 78 of lower housing member 18 leaving operating members 46a and threaded sections 46b of jack screws 46 extending outwardly from respective ends of the lower housing member 18 and housing 12 (see FIG. 2).

Upper housing member 16 is then placed onto lower housing member 18 with recesses 50,52 encompassing the front parts of connectors 88,86 and inner and outer flanges 54,83 overlapping one another. Screws 30 are then placed in holes 24 of upper housing member 16, plated-through holes 84 of mother board 20 and threaded holes 72 of mounting members 68 and tightened, thereby securing housing members 16,18 together and maintaining the circuit board assembly 14 in position within housing 12. As pointed out above, plated-through holes 84 form a ground connection with housing 12.

An important feature of the present invention is the capturing of jack screws in housing 12 and these jack screws assist in the connection and disconnection of connector 88 with its mating connector.

Another important feature of the present invention is that the shape of housing 12 enables connection of the transceivers to adjacent units without any interference.

A further feature of the present invention is the ease of assembly of the parts to form the transceivers thereby resulting in lower costs and this lends itself to the parts being assembled by automation.

What is claimed is:

1. An electrical housing for a circuit board assembly having at least one electrical connector hereon, comprising:

interfitting upper and lower housing members adapted to receive and support the circuit board assembly therewithin, the circuit board assembly being disposed therein prior to fitting and securing the housing members together;

one end of the housing members having connector-engaging portions for engaging the electrical connector on the circuit board assembly for positioning the circuit board assembly longitudinally relative to the housing members;

positioning members provided on the housing members and protecting from inside surfaces thereof spaced inwardly from said connector-engaging portions to define horizontal board-engaging surfaces for vertically positioning the circuit board assembly within the housing members; and jack screw-positioning members provided by the housing members for positioning jack screws within the housing members and maintaining the jack screws in position therein so that the jack screws are operationally captured therein.

2. An electrical housing as claimed in claim 1, wherein said housing members have flanges along opposing edges that overlap when the housing members are interfitted and secured together.

3. An electrical housing as claimed in claim 1, wherein said connector-engaging portions comprise grooves for receiving a flange of the electrical connector.

4. An electrical housing as claimed in claim 1, wherein said positioning members comprise columnar mounting members extending inwardly from an inside surface of said lower housing member, and raised members located on an inside surface of said upper housing member opposite respective columnar mounting members between which the circuit board assembly is disposed.

5. An electrical housing as claimed in claim 4, wherein said columnar mounting members and said raised members form a ground connection with the circuit board assembly.

6. An electrical housing as claimed in claim 4, wherein said columnar mounting members extend above a plane containing the ends of the front, rear and side walls of said lower housing member.

7. An electrical housing as claimed in claim 1, wherein, said jack screw-positioning members comprise aligned arcuate recesses at outer edges of front and rear walls of said housing members in which shafts of the jack screws are disposed.

8. An electrical housing as claimed in claim 7, wherein opposing extensions are located on inside surfaces of said housing members and include further arcuate recesses aligned with the arcuate recesses in said front and rear walls, said further arcuate recesses receiving annular grooves of the shafts of the jack screws thereby capturing the jack screws with the housing members when they are secured together.

9. An electrical housing as claimed in claim 1, wherein another end of the housing members includes other connector-engaging portions for engaging another connector on the circuit board assembly.

10. An electrical housing for a circuit board assembly having at least one electrical connector thereon comprising interfitting upper and lower housing members adapted to receive and support the circuit board assembly therewithin, the circuit board assembly being disposed therein prior to fitting and securing the housing members together;

one end of the housing members having connector-receiving recesses in which the electrical connector is disposed, and jack screws mounted in the housing members, characterized in that:

first positioning members are provided on the housing members and projecting from inside surfaces thereof from said connector-engaging portions to define horizontal board-engaging surfaces for vertically positioning the circuit board assembly within the housing members upon assembly of the circuit board assembly between said upper and lower housing members, second positioning members are provided by the housing members and the electrical connector for positioning the circuit board assembly longitudinally relative to the housing members, and jack screw-positioning members are provided by the housing members for positioning the jack screws within the housing members and maintaining the jack screws in position therein so that the jack screws are operationally captured therein.

\* \* \* \* \*